(12) United States Patent
Saado

(10) Patent No.: US 7,644,223 B2
(45) Date of Patent: Jan. 5, 2010

(54) CIRCUIT AND METHOD FOR PATCHING FOR PROGRAM ROM

(75) Inventor: Alon Saado, San Diego, CA (US)

(73) Assignee: VIA Telecom Co., Ltd. (KY)

( * ) Notice: Subject to any disclaimer, the term of this patent is extended or adjusted under 35 U.S.C. 154(b) by 408 days.

(21) Appl. No.: 11/589,355

(22) Filed: Oct. 30, 2006

(65) Prior Publication Data

US 2008/0112205 A1 May 15, 2008

(51) Int. Cl.
*G06F 12/02* (2006.01)
*G06F 12/06* (2006.01)

(52) U.S. Cl. .................. 711/102; 711/154; 711/217; 365/189.07

(58) Field of Classification Search .................. 711/102, 711/154, 217; 365/189.07
See application file for complete search history.

(56) References Cited

U.S. PATENT DOCUMENTS

| | | | | |
|---|---|---|---|---|
| 4,610,000 A | | 9/1986 | Lee | 365/189 |
| 6,135,651 A | * | 10/2000 | Leinfelder et al. | 717/168 |
| 6,438,664 B1 | * | 8/2002 | McGrath et al. | 711/154 |
| 6,891,765 B2 | | 5/2005 | Saado | 365/200 |
| 2005/0030796 A1 | * | 2/2005 | Saado | 365/189.07 |
| 2006/0174244 A1 | * | 8/2006 | Woods et al. | 717/174 |

* cited by examiner

*Primary Examiner*—Matt Kim
*Assistant Examiner*—Michael C Krofcheck
(74) *Attorney, Agent, or Firm*—K&L Gates LLP

(57) ABSTRACT

This invention discloses a system comprising a first comparator circuit configured to assert a first control signal in response to a first input number matching one of a first numbers stored therein, a second comparator circuit configured to assert a second control signal in response to: (i) at least one latched assertion of the first control signal; (ii) a second input number matching an intermediate number produced by incrementing the first input number; and (iii) an assertion of an input signal, and to de-assert the second control signal absent of either the matching between the second input number and the intermediate number or the de-assertion of the input signal, and a generator circuit configured to output a predetermined instruction data stored therein in response to the assertion of the first control signal, and to output a third number in response to the assertions of the second control signal.

19 Claims, 7 Drawing Sheets

CIRCUIT AND METHOD FOR PATCHING FOR PROGRAM ROM

BACKGROUND

The present invention relates generally to a programmable system design, and, more particularly, to patching for program codes in a Read-Only-Memory (ROM).

Many programmable systems employ core processors, such as digital signal processors (DSPs), which can execute instructions stored in embedded program memories. The embedded program memory can be implemented as a random access memory (RAM), a ROM or combination of RAM and ROM. The program data stored in ROM cannot be modified after initial programming.

Patching gives a programmer an option to "overwrite" part of the code in the ROM, and replace them with different instructions in order to fix bugs or enhance a particular feature. Patching is often implemented by redirecting the normal flow of the code to a patch code.

A prior art approach presented in U.S. Pat. No. 6,891,765 by the same inventor has limitations. In that approach, when there is a need to patch a part of program codes, the user assigns a "match address" to the new program codes. When that match address is put on an address bus, a patch logic supplies a branch opcode (e.g., 0x4180 in TeakLite DSP). It is assumed that the processor reads a consecutive address (i.e., "match address+1") in the following cycle, and therefore, the patch logic always supplies the patch address in the following cycle. But sometimes, although the processor may output the consecutive address on the address bus, it needs another cycle to process internal data, and the processor may read the patch address from the data-in bus not in the following cycle but in one of the later cycles. In this case, the processor may read wrong data and undesirable behavior may happen. The patch address should only be supplied in the cycle when the processor reads the data-in bus.

As such, what is desired is a patching logic that redirects normal program flow to a patching program code in all cases and in any execution flow.

SUMMARY

There is a need for the following embodiments. Of course, the invention is not limited to these embodiments.

According to a first embodiment of the invention, a code storage control circuit comprises a first comparator circuit configured to assert at least one first control signal in response to a first input number matching one of a plurality of first predetermined numbers stored therein, and de-asserts the first control signal absent of the matching between the first input number and one of the first predetermined numbers; a second comparator circuit configured to assert a second control signal in response to: (i) at least one delayed assertion of the first control signal; (ii) a second input number matching an intermediate number produced by adding a second predetermined number to the first input number; and (iii) an assertion of an input signal, and to de-assert the second control signal absent of either the matching between the second input number and the intermediate number or the de-assertion of the input signal; and a generator circuit configured to output a predetermined instruction data stored therein in response to the assertion of the first control signal, and to output a third predetermined number corresponding to the first input number in response to the assertions of the second control signal.

According to a second embodiment of the invention, an electronics system comprises a first comparator circuit configured to assert at least one first control signal in response to a first address matching one of a plurality of first predetermined addresses stored therein, and de-assert the first control signal absent of the matching between the first address and one of the first predetermined addresses; a second comparator circuit configured to assert a second control signal in response to: (i) at least one latched assertion of the first control signal; (ii) a second address matching an intermediate address produced by adding a predetermined number to the first address; and (iii) an assertion of an input signal, and to de-assert the second control signal absent of either the matching between the second address and the intermediate address or the de-assertion of the input signal; a generator circuit configured to output a predetermined instruction data stored therein in response to the assertion of the first control signal, and to output a second predetermined address corresponding to the first address in response to the assertions of the second control signal; one or more processors responsible for issuing the first and second addresses to both the first and second comparators and for issuing the input signal as well as for reading the predetermined instruction data and the second predetermined address; and one or more memories for storing computer codes, wherein the first and second addresses as well as the first and second predetermined addresses point to.

According to a third embodiment of the invention, a method for generating a patch address for a program ROM comprises asserting at least one first control signal in response to a first address matching one of a plurality of a first predetermined address; asserting a second control signal in response to (i) at least one latched assertion of the first control signal; (ii) a second address matching an intermediate address produced by adding a predetermined number to the first address; and (iii) an assertion of an input signal; outputting a predetermined instruction data in response to the assertion of the first control signal, and outputting a second predetermined address corresponding to the first address in response to the assertions of the second control signal; reading the predetermined instruction data in lieu of the data in the program ROM, which is pointed to by the first address and reading the second predetermined address as a patch address in lieu of the data stored in the program ROM, which is pointed to by the second address.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention may be implemented to provide a patch mechanism for an embedded system employing a read only memory (ROM). Such patch mechanisms may provide flexibility to an end user. The implementation may be optimized for particular digital signal processor (DSP) cores (e.g., TeakLite DSP core), but may be implemented for other DSP cores, processors, and/or subsystems to meet the design criteria of a particular implementation. The timing of the present invention may be adjusted to accommodate a particular processor core. The present invention may be implemented in the context of a patch mechanism in a DSP subsystem, but may also be implemented in other types of core circuits or modules that implement a program memory that may not be readily modified.

In general, a processor accesses a program ROM to read instructions. When instructions need to be replaced or added, a patch logic circuit may be used to redirect the normal flow of the code to a patch code. The redirecting is generally done by forcing a branch instruction to be read instead of the instruction in the program ROM. Hence, the redirecting could be implemented as hardware, software, or any combination of hardware and software in accordance with the spirits of the present disclosure.

Figure 1:
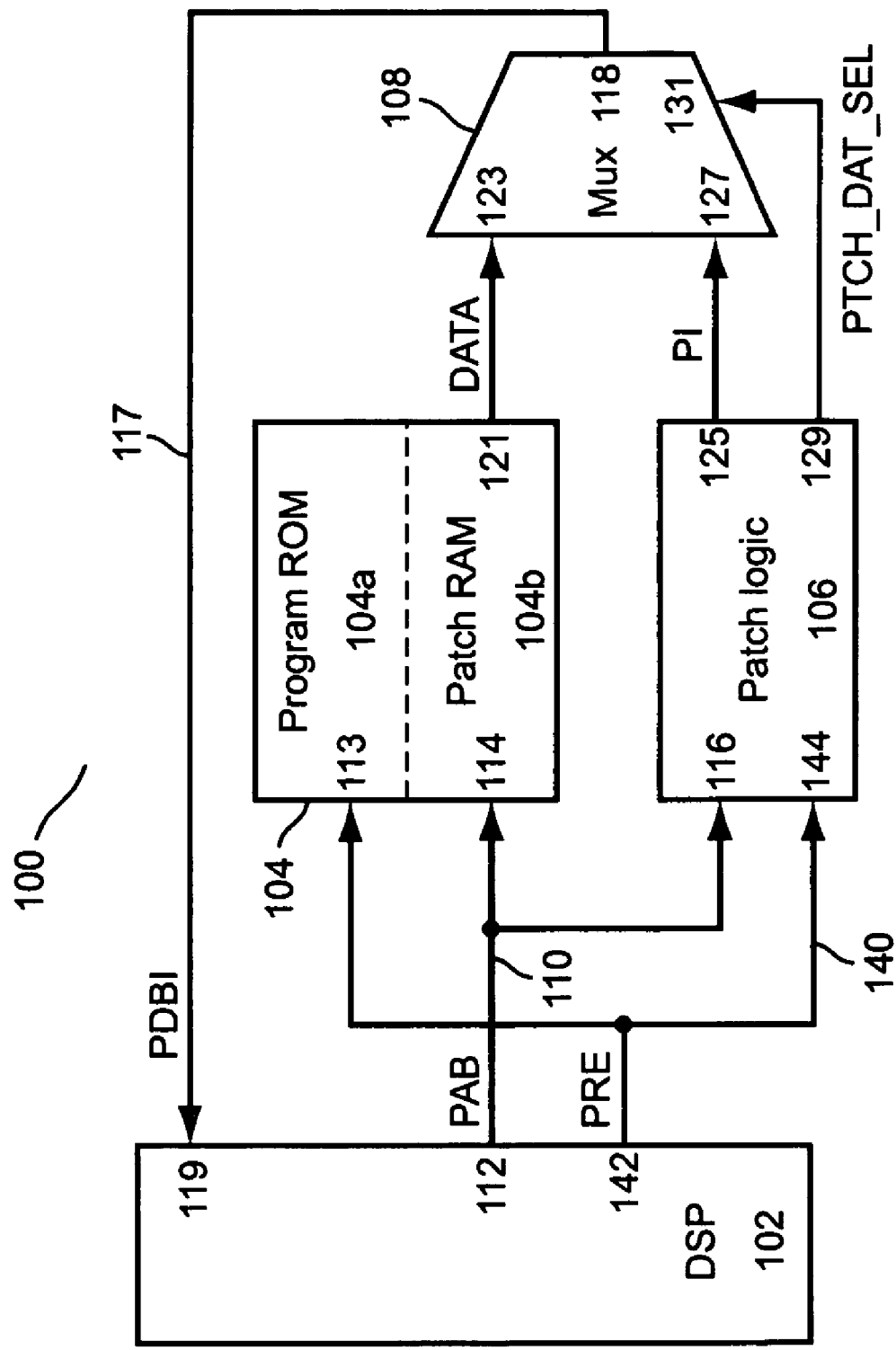
FIG. 1 is a block diagram illustrating a programmable system implementing a patching mechanism according to one embodiment of the present invention.

FIG. 1 is a block diagram illustrating a programmable system 100 implementing a patching mechanism according to one embodiment of the present invention. The programmable system 100 generally comprises a processor 102, a program space circuit (or section) 104, a patch logic circuit (or section) 106, and a selection circuit (or section) 108. For convenience of simplifying and concentrating on describing the ideas of the present disclosure, the block diagram omits some components usually contained in the programmable system 100. Ordinary people skilled in the art could understand that the omission of those components does not limit the scope of the present disclosure. The processor 102 may be implemented as a digital signal processor (DSP) or other processor appropriate to meet the design criteria of a particular implementation. The program space circuit 104 may be implemented as a memory defining a memory space addressable by the processor 102 no matter if it is continuous or not. The memory 104 may comprise a program memory (or section) 104a and a patch memory (or section) 104b. The program memory 104a may be configured as a ROM type memory spanning a first address range of the memory space. The program memory 104b may be configured as a RAM type memory spanning a second address range of the memory space. The program memory 104a and the program memory 104b may be implemented as separate memories or as a single memory with a ROM portion and a RAM portion. The patch logic circuit 106 as well as the selection circuit 108 may be implemented within a DSP subsystem. The selection circuit 108 may be implemented as a multiplexer or other appropriate selection device.

A program address bus (PAB) 110 is generally connected between an output 112 of the processor 102 and (i) an input 114 of the program space circuit 104 and (ii) an input 116 of the patch logic circuit 106. An address signal may be generated by the processor 102 and received substantially and simultaneously by both the program circuit 104 and the patch logic circuit 106. The address bus PAB 110 is shown implemented as a 16-bit bus in the embodiment. However, other bus widths may be implemented to meet the design criteria of a particular implementation.

A program data in bus (PDBI) 117 is generally connected between an output 118 of the multiplexer 108 and an input 119 of the processor 102. A data signal may be returned from the selection circuit 108 to the processor 102. The data in bus PDBI 117 may carry a variety of data items such as, but not limited to, instructions, addresses and/or user data. The data in bus PDBI may be implemented as a 16-bit bus in the embodiment. However, other bus widths may be implemented to meet the design criteria of a particular implementation.

A data bus DATA is generally connected between an output 121 of the memory 104 and an input 123 of the multiplexer 108. Either main codes stored in the program ROM 104a or patch code stored in the patch RAM 104b may be presented to the data bus DATA in response to the address received at the input 114 of the memory 104.

The patch logic circuit 106 may generate a signal, based on the addresses on the address bus PAB 110, at an output 125, which is generally connected to an input 127 of the multiplexer 108 by a patch in bus (PI). The patch logic circuit 106 may also generate a select or control signal (PTCH_DAT_SEL) at an output 129 to a control input 131 of the multiplexer 108, also based upon the addresses on the address bus PAB 110.

The processor 102 also generates a program read enable (PRE) signal 140 at an output 142 of the processor 102 and sends it to an input 113 of the memory 104 as well an input 144 of the patch logic circuit 106. The signal PRE 140 can enable or disable a read operation of the memory 104. The signal PRE 140 can also de-assert the signal PTCH_DAT_SEL to prevent a patch address from being supplied to the processor 102.

In general, either the program ROM 104a or the patch RAM 104b may be read in response to the particular address PAB 140 presented on the address bus 110. The patch logic circuit 106 generally controls the multiplexer 108 and may force a branch instruction (opcode or command) potentially followed by a branch address. The branch address, which may be read from a register within the patch logic circuit 106 (to be described in more detail in connection with FIG. 2) generally comprises an address within the address range (or space) of the patch RAM 104b. Therefore, after executing the branch instruction, the processor 102 may execute one or more instructions from the patch RAM 104b. The instructions in the patch RAM 104b will generally include another branch instruction and an associated branch address back into the program ROM 104a.

Referring to FIG. 1, the programmable system 100 is initially programmed with predetermined match addresses and patch addresses in the patch logic circuit 106. When the processor 102 executes a code, it puts an address on the address bus PAB 110 and read in the data on the data-in bus PDBI. If the address on the address bus PAB 140 matches one of the predetermined match addresses, the patch logic circuit 106 forces a branch opcode (0x4180 in case of the TeakLite DSP Core) instead of the opcode from the Program ROM 104a on the data-in bus PDBI 117. In the subsequent cycles, if there is also a match between a new address and the [match_address+1] (i.e., the consecutive address of the predetermined match address), then the patch logic circuit 106 forces a target address, again, instead of the opcode from the Program ROM onto the data-in bus PDBI 117. But the target address will only be forced when the read enable PRE 140 is asserted. Otherwise the address matching will simply be ignored.

When the processor 102 executes a branch command, the program branches to the new code stored in the patch RAM 104b based on the target address provided by the patch logic circuit 106, and then the patch code will executed. At the end of the patch code, a branch command is executed to return the processor 102 to the main code in the Program ROM.

The aforementioned address matching, in essence, is a matching between two numbers, one issued by the processor 102, the other stored in the patch logic circuit 106.

Figure 2:
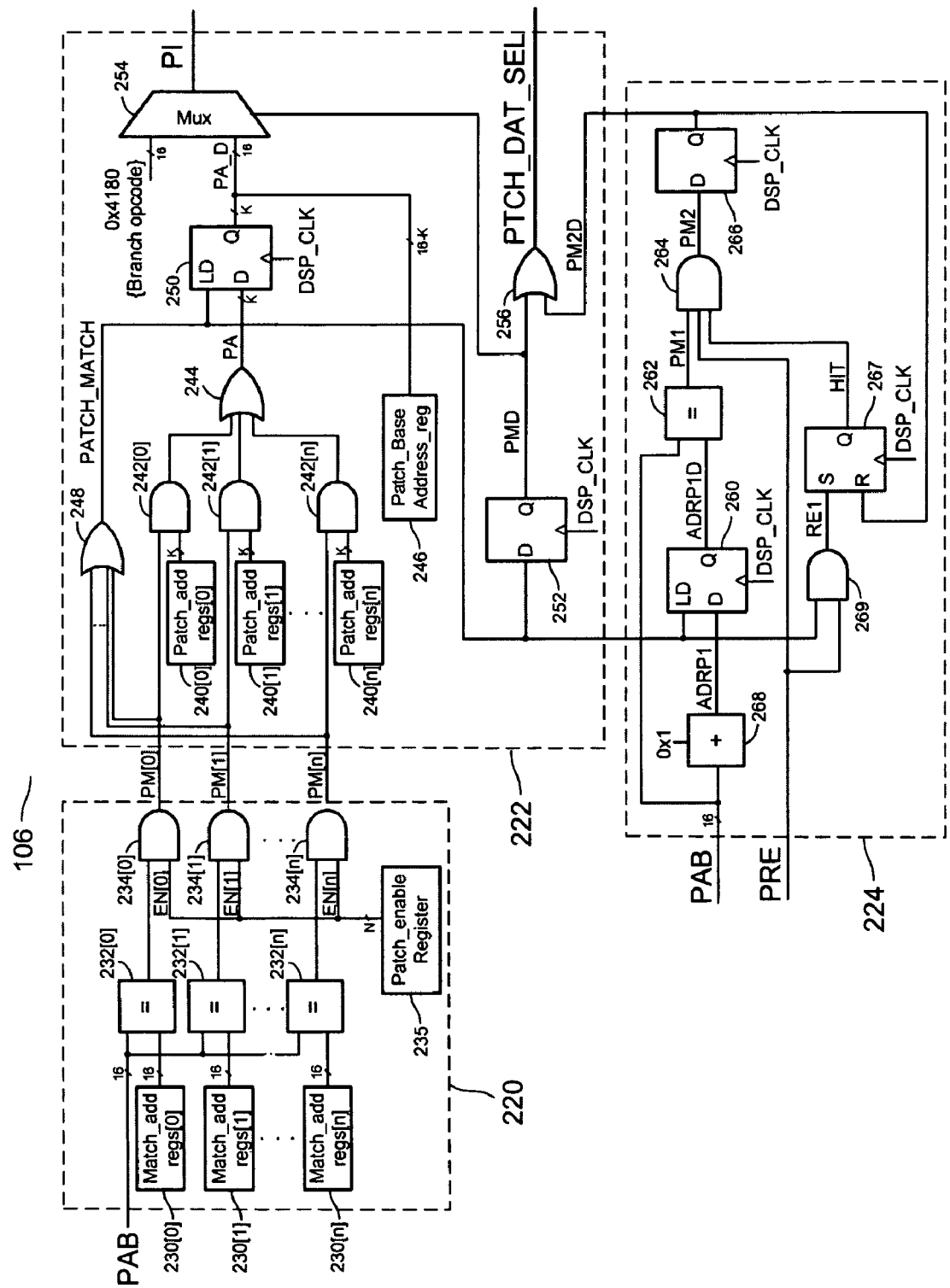
FIG. 2 is a schematic diagram illustrating an implementation of the patch logic circuit shown in FIG. 1.

FIG. 2 is a schematic diagram illustrating an implementation of the patch logic circuit shown in FIG. 1. The patch logic circuit 106 generally comprises a block (or section) 220, a block (or section) 222 and a block (or section) 224. The block 220 may be implemented as a comparator match address section. The block 222 may be implemented as a patch_address generator section. The block 224 may be implemented as a comparator match (address+1) section.

The block 220 generally comprises a number of registers 230[0:n], a number of logic blocks 232[0:n] and a number of gates 234[0:n]. The registers 230[0:n] each may contain a predetermined address (which may be a first address of a particular portion of code) stored in the program ROM 104a that a programmer intends to replace. The predetermined addresses may indicate locations of lines of codes stored in the program ROM 104a intended to be patched, repaired or expanded. Each of the logic blocks 232[0:n] may be implemented as a comparator configured to generate a match signal (e.g., PM[0]~PM[n]) by comparing an address on the address bus PAB 140 with one of the predetermined addresses stored in the registers 230[0:n]. Each of the gates 234[0:n] may be implemented as a logical AND gate configured to assert match signals PM[0:n], which in turn enable/disable a number of predetermined patch or target addresses stored in a number of patch address register 240[0:n] in block 222.

Each of the gates 234[0:n] has a first input that may receive a signal from one of the logic blocks 232[0:n] and a second input that may receive one of a number of enable signals (EN[0:n]). The enable signals EN[0:n] may be generated by a patch enable register 235 or may be received externally. When EN[x]="1", x patch is enabled. If EN[x]="0", x patch is disable. Each patch address has a designated bit (one of the EN[0:n]) in the patch enable register 235, or a dedicated external enable signal. During initialization, one or more of the match address registers 230[0:n] may be programmed with a respective match address, and their associated patch address registers 240[0:n] may be programmed with a respective patch address. Particular patches to be enabled may have their enable signals among EN[0:n] set to "1".

The block 222 generally comprises a number of registers 240[0:n], a number of gates 242[0:n], a gate 244, a register 246, a gate 248, a block 250, a block 252, a block 254 and a block 256. The registers 240[0:n] may be implemented as patch address registers for storing patch addresses. The target addresses may provide the first addresses of a new portion of codes within the patch RAM 104b that provides the patch or replacement instructions to the main code. A program executed by the processor 102 may branch to a particular patch address if a match between an address issued on the address bus PAB and a particular address stored in the match address registers 230[0:n] occurs. The gates 242[0:n] may be implemented as logical AND gates. The gates 242[0:n] allows the match signals PM[0:n] to assert/de-assert the patch addresses stored in the registers 240[0:n].

The gate 244 and the gate 248 may be implemented as logical OR gates. The gate 244 may pass an asserted patch address (PA) to a block 250. The gate 248 may assert a signal (PATCH_MATCH) when any one of the match signals PM[0:n] is asserted. Here, when PM[x]="1", the match signal PM[x] is asserted.

The block 250 may be implemented as a D flip-flop with a load-enable capability. The flip-flop 250 may load the asserted patch address PA in response to an assertion of the signal PATCH_MATCH. The flip-flop 250 may present a stored version of the asserted patch address PA upon an edge (e.g., rising) of a clock signal (DSP_CLK). The register 246 may be implemented as a base address register for storing a base address of the address range for the patch RAM 104b. The stored version of the branch address PA may be concatenated with the base address to form a complete patch address (PA_D) synchronized with the clock signal DSP_CLK. As shown in FIG. 2, the patch address stored in the registers 240[0:n] is k-bit wide, wherein k is an integer between 1 and 16. In this embodiment, the size of the patch RAM 104 may be corresponding to k. For example, if the size of the patch RAM 104 is 4K of $2^{12}$, k would be 12. The base address stored in the register 246 is (16-k) bit wide, the concatenated complete patch address on PA_D is then 16 bit wide. The complete patch address PA_D is shown implemented as a 16-bit bus. However, other bus widths may be implemented to meet the design criteria of a particular implementation.

The block 252 may be implemented as a D flip-flop. The flip-flop 252 may store the signal PATCH_MATCH on an edge (e.g., rising) of the clock signal DSP_CLK. The flip-flop 252 may present a signal (PMD) as a delayed version of the signal PATCH_MATCH synchronized to the clock signal DSP_CLK. The block 254 may be implemented as a multiplexer. The multiplexer 254 may multiplex a predetermined branch instruction (or opcode) (e.g., 0x4180) and the signal PA_D to generate the signal PI as controlled by the signal PMD or delayed signal PATCH_MATCH.

The gate 256 may be implemented as a logical OR gate. The gate 256 may generate the control signal PTCH_DAT_SEL from the signal PMD and an indication signal (PM2D). While each of the circuit elements of the block 222 are shown illustrating specific implementations, each of the circuit elements of the block 222 may be modified accordingly to meet the design criteria of a particular implementation.

The block 224 generally comprises a block (or circuit) 260, a block (or circuit) 262, a block (or circuit) 264, a block (or circuit) 266, a block (or circuit) 267, a block (or circuit) 268 and a block (or circuit) 269). The block 260 may be implemented as a D flip-flop with a load-enable feature. The block 262 may be implemented as a comparator. Both the blocks 264 and 269 may be implemented as a logical AND gate. The block 266 may be implemented as a D flip-flop. The block 267 may be implemented as an S-R flip-flop. The block 268 may be implemented as a multi-bit adder. Each of the flip-flops 260, 266 and 267 may receive the clock signal DSP_CLK.

The adder 268 may generate an intermediate address (ADRP1) by adding a predetermined value (e.g. 0x1) to a first address of a first clock cycle on the address bus PAB 140. When the predetermined value is "1", it indicates that the processor 102 should issue consecutive addresses when intending to allow patching codes.

The flip-flop 260 may latch the intermediate address ADRP1 when loading is enabled by the asserted signal PATCH_MATCH. A delayed intermediate address (ADRP1D) may be presented by the block 260 upon an edge (e.g., rising) of the clock signal DSP_CLK. The comparator 262 may generate a result signal (PM1) based upon a comparison of a second address of a second clock cycle subsequent to the first clock cycle and the delayed intermediate address ADRP1D. The gate 269 may enable/disable a signal RE1 by and-logic-operation of a read enable signal PRE and the signal PATCH-MATCH. An enabling of the signal RE1 sets a signal HIT to "1" on an edge (e.g., rising) of the clock signal DSP_CLK through the SR flip-flop 267. The gate 264 may enable/disable a result signal PM2 by and-logic-operation of signals PM1, PRE and HIT. The flip-flop 266 may store the enabled/disabled result signal PM2 on an edge (e.g., rising) of the clock signal DSP_CLK. The flip-flop 266 may present the stored value of the signal PM2 as the indication signal PM2D. An enabled signal PM2D in turn will reset the signal HIT to "0" on the same edge of a next clock cycle of the clock signal DSP_CLK. The reset HIT signal will disable signal PM2 in a subsequent clock cycle. The signals PMD or PM2D may enable the signal PTCH_DAT_SEL through the OR gate 256. An enabled signal PTCH_DAT_SEL may force the multiplexer 118 to select signal PI as an output signal for the data in bus PDBI 117 (referring to FIG. 1).

While each of the circuit elements of the blocks 220, 222, and 224 are shown illustrating specific implementations, each of the circuit elements of the blocks 220, 222, and 224 may be modified accordingly to meet the design criteria of a particular implementation.

Referring to both FIGS. 1 and 2, when the processor 102 executes a code, the processor 102 presents a sequence of the addresses on the address bus PAB 110 and reads instruction items from the data-in bus PDBI 117. When an address matches an address initially stored in one of the match address registers 230[0:n], the patch logic 106 generally transmits a patch opcode (e.g., 0x4180 in case of the TeakLite DSP Core) instead of the data item (e.g., an opcode) from the program ROM 104a onto the data bus PDBI 117. In the next clock cycle, if there is a match between a next address on the address bus PAB 140 and the intermediate address ADRP1D (i.e., current_address=match_address+1) indicating consecutive addresses in the address space, the patch logic 106 may generate a patch address, PA_D, instead of the next data item (another opcode or operand) from the program ROM 104a. The multiplexer 108 may be commanded to return the patch address PA_D to the processor 102 on the data bus PDBI 117 only if the read enable signal PRE 140 is enabled by the processor 102. If the processor 102 chooses not to read the opcode from the consecutive address (i.e., match_address+1), and instead to read a different address from the program 104a or perform a different operation (e.g., write operation), it can disable the signal PRE 140, which deasserts the signal PTCH_DAT_SEL, so that no patch address may be supplied to the data-in bus PDBI.

If the patch instruction generated by the patch logic circuit 106 is executed by the processor 102 and the running program branches to a new portion of the code in the patch RAM 104b, the new portion of the code may be executed by the processor 102. At the end of the patch code, another branch instruction and branch address may return the program to the main code in the program ROM 104a.

In general, as the address bus PAB 110 is 16 bit wide, all of the 16-bit addresses may be compared to the predetermined addresses loaded into the match address registers 230[0:n]. Therefore, there may be no restrictions for the predetermined address or the addresses issued by the processor 102. Also, the patch address registers 240[0:n] may be implemented as k-bit wide registers, where k is an integer less than a width of the address bus PAB 110. The patch address registers 240[0:n] generally include the lower bits of the patch address PA_D. The size k of the patch address registers 240[0:n] may be determined by the size of the patch RAM 104b. For example, in case of a 1024×16 bit patch RAM 104b, the width k of the patch address registers 240[0:n] may be 10 bits. An implementation storing less than all of the bits for the addresses PAB 110 generally reduces the gate count in the patch logic circuit 106.

The higher or most significant bits of the patch address PA_D, which is identical to all the patch addresses stored in the patch address register 240[0:n], may be programmed in the register 246. Therefore, the programmer generally has flexibility of the location of the patch RAM 104b within the program address space of the DSP 102 and/or the address range of the program ROM 104a.

When there is a match between a current address on the address bus PAB 110 and one of the match address registers 230[0:n], a match signal PM[x], where x is an integer between 0 and n, representing a matched address, generally transitions (or is asserted) to a logical HIGH state. The asserted match signal PM[x] may assert the signal PATCH_MATCH. Assertion of the signal PATCH_MATCH may load the target patch address into the flip-flop 250 and the intermediate address ADRP1 into the flip-flop 260. It may also assert the output of the flip-flop 267 (HIT signal). The signal PATCH_MATCH may also be delayed (i.e., the delayed signal PMD) by one cycle to meet timing constraints of a particular core (e.g., TeakLite DSP Core). For example, a particular read address PAB 110 may be supplied on the address bus 110 in one cycle of the clock signal DSP_CLK and the data may be captured by the processor 102 from the data bus PDBI 117 in the next cycle of the clock signal DSP_CLK.

In the next cycle, a target patch address may be driven onto the data bus PDBI 117 to the processor 102. The next value of the address on the address bus PAB 110 may also be compared to a value of the delayed intermediate address ADRP1D. If there is a match between the next address and the intermediate address values, and if the HIT signal is asserted, the patch address PA_D may be driven onto the data bus PDBI 117 causing the program to branch to that address.

A return address is generally added at the end of the patch code to return to execute commands from the ROM 104a. The return address may be a consecutive address to the addresses in the registers 230[0:n] (i.e., patching only one command). In such a case, the signal PATCH_MATCH may not transition to the logical HIGH state because the new address may not match any of the predetermined addresses stored in the registers 230[0:n]. Therefore, the processor 102 may resume reading opcodes and operands taken from the program ROM 104a.

Figure 3A:
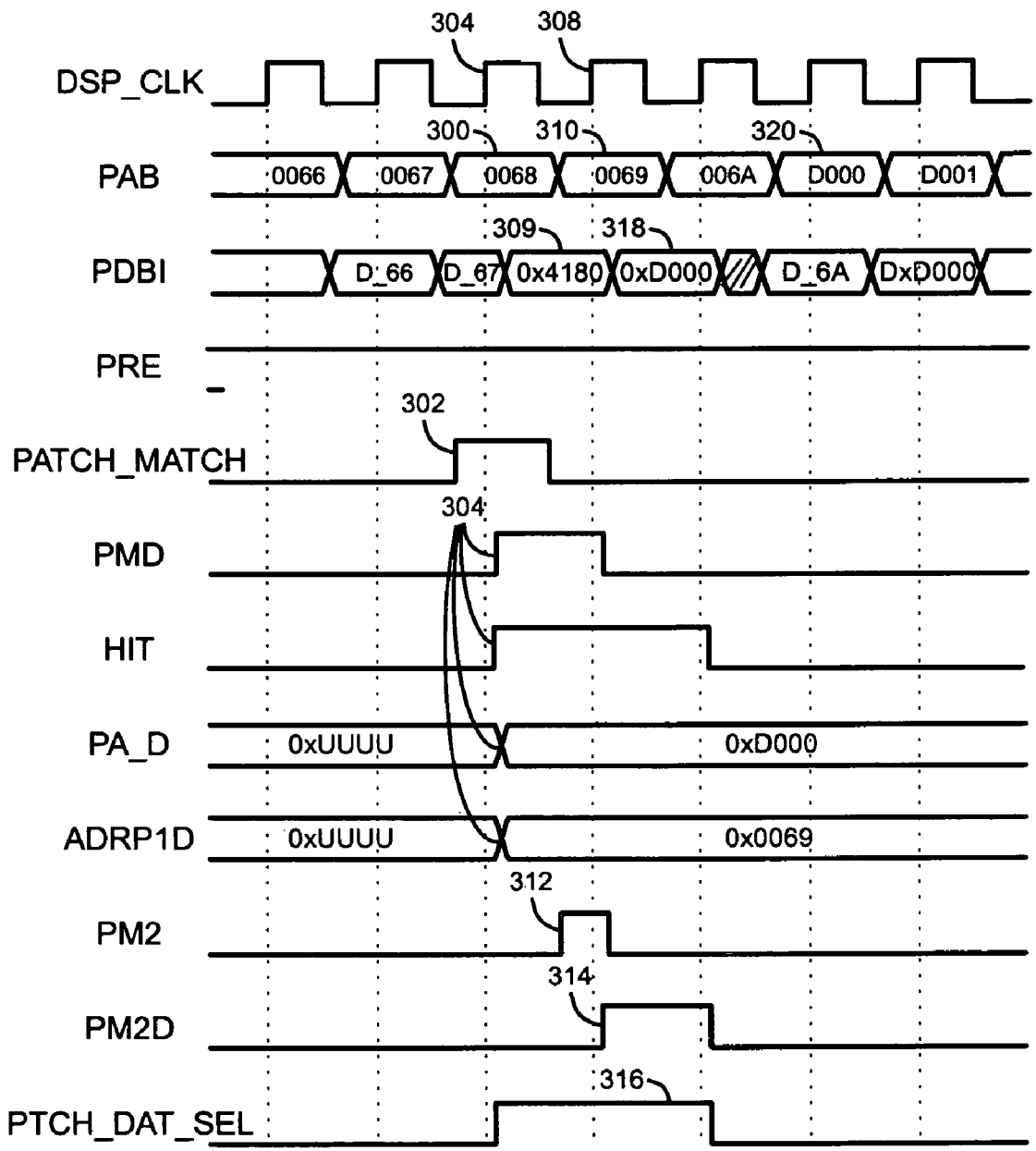
FIG. 3A–3D are timing diagrams illustrating timing relationships among various signals shown in FIGS. 1 and 2 in different cases.

FIG. 3A is a timing diagram illustrating timing relationships among various signals shown in FIGS. 1 and 2. In this case the read enable signal PRE 140 stays enabled, so that potential patching operations will not be hindered. The predetermined address triggering a match in the example is illustrated as 0x0068 (300). The target branch or patch address within the patch RAM 104b is illustrated as 0xD000. The address on the address bus PAB 110 is 0x0068, the signal PATCH_MATCH may transition to the logical HIGH state (302). The patch logic circuit 106 may load the patch address, 0XD000, into the flip-flop 250 and the intermediate address ADRP1=0x0068+1=0x0069 into the flip-flop 260. The flip-flops 250, 252 and 260 may synchronize the signals PATCH_MATCH, PA and ADRP1 to a clock DSP_CLK edge (304) to update the signals PMD, HIT, PA_D and ADRP1D (306). The multiplexer 254 responds to the asserted signal PMD by routing the branch opcode (0x4180) to the multiplexer 108.

The multiplexer 108 may respond to the asserted signal PMD, through the gate 256 to the control signal PTCH_DAT_SEL, to route the branch opcode (0x4180) to the processor 102 on the data in bus PDBI (309).

If the processor 102 puts 0x0069(310) on the address bus PAB 110 as a next address, another match may be identified in the comparator match (address+1) section 224 and the target branch or patch address PA may be presented by the patch logic 106 in the data-in bus PDBI 117. In this example, the comparator 262 may assert the signal PM2 (312) gated through the gate 264. The flip-flop 266 may present the delayed signal PM2D (314) on a clock DSP_CLK rising edge 308. The asserted signal PM2D may hold the control signal PTCH_DAT_SEL in the logical HIGH state (316) while the patch address 0xD000 is driven onto the data-in bus PDBI (318). After decoding the branch opcode 0x4180, the processor 102 may branch to the patch address 0xD000 (320).

Figure 3B:
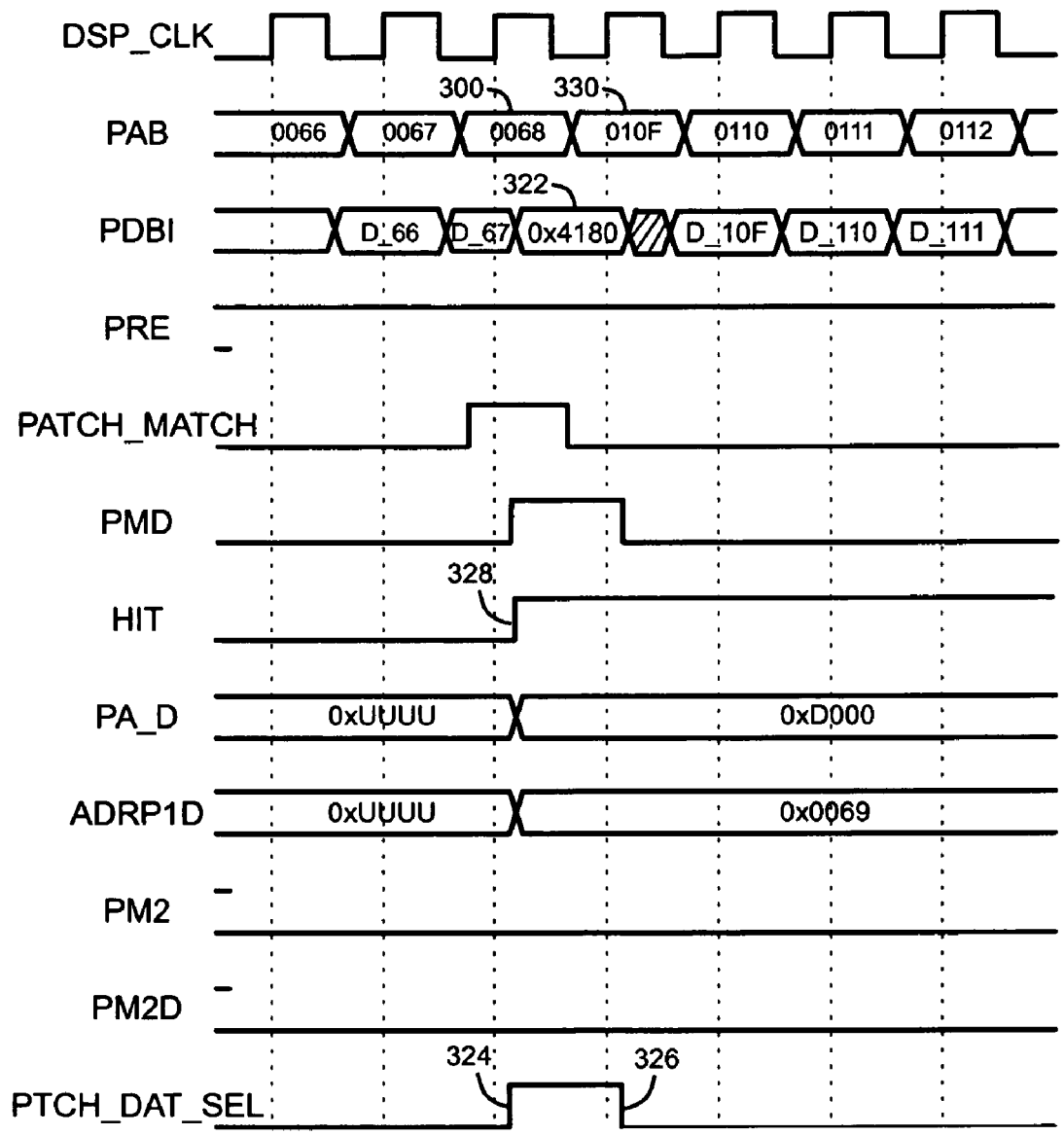

FIG. 3B is a timing diagram illustrating timing relationships when the next address issued by the processor 102 is not equal to the intermediate address (e.g., previous_address+1). In this case, the read enable signal PRE 140 stays enabled, and potential patching operations will not be hindered. Referring to FIG. 3B, a first opcode of the branch instruction (e.g., 0x4180) may be fetched (322) by the processor 102 as the signal PTCH_DAT_SEL is turned to a logic HIGH state (324) due to the a first matching address 0x0068 (300). However, the next address is 0x010F (330), which is not sequential to the previous address (300). As a result, the comparator 262 may not find a match between the next address (0x010F) and the intermediate address ADRP1D (0x0068+1=0x0069). The next address (0x010F) does not have a match in the match address register 230[0:n], either. Therefore, the signal PTCH_DAT_SEL will be turned low (326), and the comparator 262 may leave the signal PM2 in the logical LOW state. After the branch opcode has been read from the data-in bus PDBI 117, the control signal PTCH_DAT_SEL may be transitioned to the logical LOW state causing the multiplexer 108 to route data items DATA from the program ROM 104a. In this case, the first opcode of the branch instruction (0x4180) is ignored. Instructions are continuously read from the program ROM 104a. Note that the signal HIT is asserted (328) when the first match address occurs. The signal HIT will remain asserted until a next patch will be completed. The assertion of the signal HIT may cause problems in some rare cases. Therefore, it is not recommended to patch a piece of codes immediately after an instruction that may change the execution flow (e.g., conditional branch instruction).

Figure 3C:
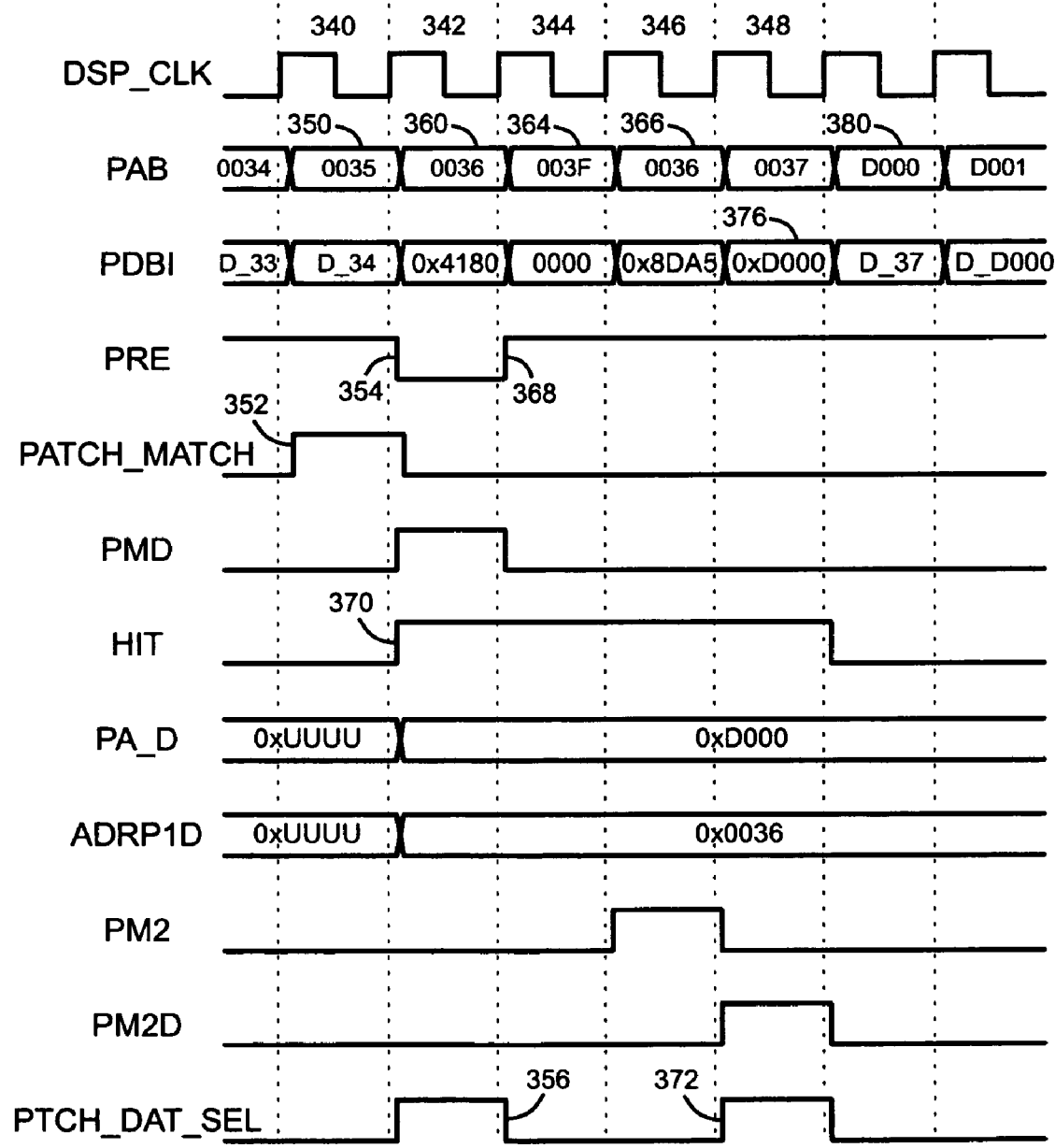

FIG. 3C is a timing diagram illustrating timing relationships when the read enable signal PRE is not asserted, even though the next address issued by the processor 102 is equal to the intermediate address (e.g., previous_address+1). In this case, the match address is 0x0035 (350). The patch address within the patch RAM 104b is again 0xD000. In a first clock cycle (340), a match address, 0x0035 is issued by the processor 102 into the address bus PAB (350). The signal PATCH_MATCH is asserted (352). During the next clock cycle (342), the branch opcode 0x4180 is loaded onto the data-in bus PDBI. Even though a second address issued in this cycle is 0x0036 (360), consecutively matching the match address 0x0035, the read enable signal PRE is de-asserted by the processor 102 (354), the signal PTCH_DAT_SEL is de-asserted (356). Therefore, the patch logic does not supply the patch address. In the third clock (344), the processor 102 reads from an address 0x003F (362). In a fourth clock cycle (346), the consecutively match address 0x0036 is issued again (366). Meanwhile the read enable signal PRE is asserted (368). Since the signal HIT is already asserted (370) by the match address 0x0035, the signal PTCH_DAT_SEL is asserted (372), and the patch address 0xD000 will be supplied to the processor 102 (376) in a fifth clock cycle (348). After decoding the instruction, the processor 102 may branch to the patch address 0xD000 and start executing the code from there (380).

Figure 3D:
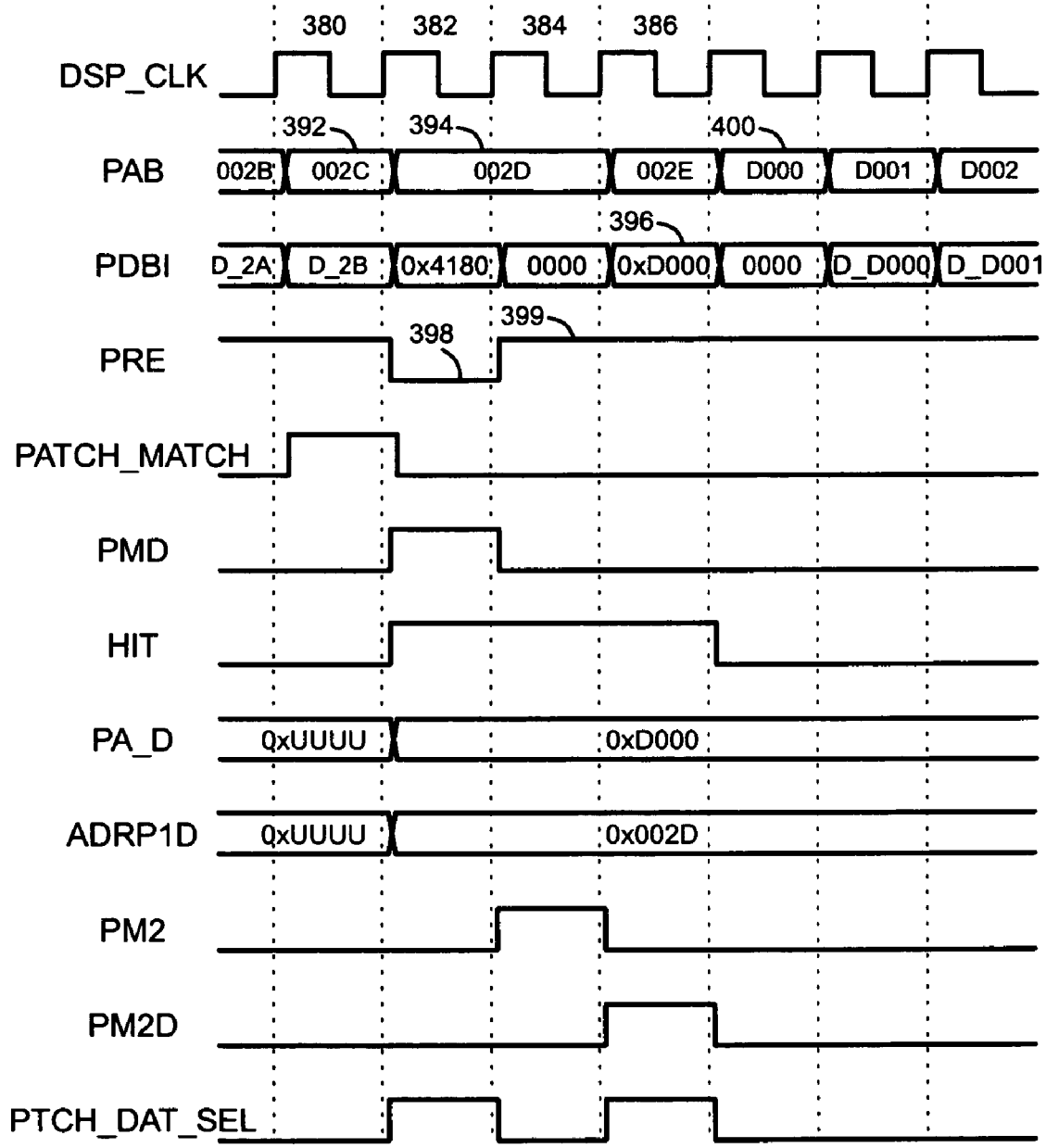

FIG. 3D is a timing diagram illustrating a case when the read enable signal PRE is de-asserted and re-asserted while a consecutive address is still on the address bus. Here, a match address is 0x002C (392), and the consecutive address is 0x002D (394), which lasted for two clock cycles (382 and 384). During the clock cycle 382, the read enable signal PRE is de-asserted (398), so that a patch address (0xD000) is not supplied to the data-in bus PDBI in the following clock cycle (384). In the clock cycle 384, the signal PRE is re-asserted (399) while the address bus PAB is issued the consecutive address 0x002D again (394), then the patch address (0xD000) will be supplied to the processor 102 through the data-in bus PDBI. After decoding the instruction, the processor 102 branched to that address and start executing the code from there (400).

Figure 4:
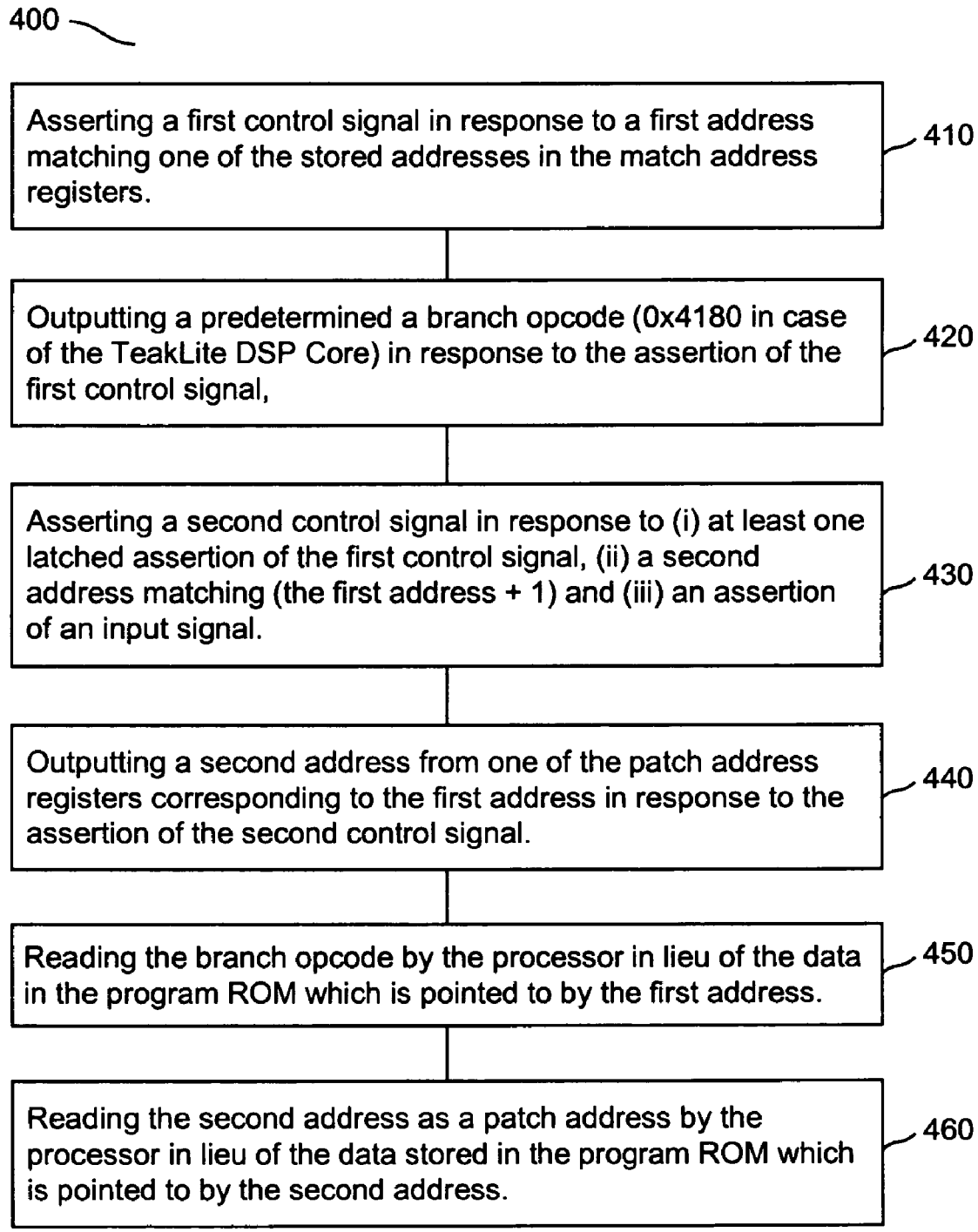
FIG. 4 is a flow chart illustrating steps of generating a patch address according to the embodiment of the present invention.

FIG. 4 is a flow chart 400 illustrating steps of generating a patch address according to the embodiment of the present invention. In step 410, the patch logic circuit 106 shown in FIG. 1 asserts a first control signal in response to a first address matching one of the stored addresses in the match address registers 230. In step 420, the patch logic circuit 106 outputs a branch opcode (0x4180 in case of the TeakLite DSP Core) in response to the assertion of the first control signal. In step 430, the patch logic circuit 106 asserts a second control signal in response to: (i) at least one latched assertion of the first control signal; (ii) a second address matching (the first address+1) and (iii) an assertion of an input signal. In step 440, the patch logic circuit 106 outputs a second address from one of the patch address registers corresponding to the first address in response to the assertion of the second control signal. In step 450, the processor 102 shown in FIG. 1 reads the branch opcode in lieu of the data in the program ROM 104a, which is pointed to by the first address. In step 460, the processor 102 also reads the second address as a patch address in lieu of the data stored in the program ROM 104a which is pointed to by the second address. The foregoing steps illustrate a method of generating a patch address for the programmable system 100 shown in FIG. 1.

The present invention provides flexibility in the patch RAM 104b location, the program address space and the patch RAM 104b size, while keeping a low gate count. The present invention also provides flexibility for the number of patches implemented. No restrictions generally exist on the size of the patch code other than the capacity of the patch RAM 104b. After branching to the patch code, the processor 102 may start executing instructions taken from the patch RAM 104b. At the end of each patch code, there may be a branch command and a branch address to an instruction stored in the program ROM 104a. Since the patch code may be in a RAM 104b, there may be flexibility regarding the content of the patch code itself. Furthermore, there may be no restrictions on the return addresses to the program ROM 104a. In one example, the consecutive address of the match address may be the return address. Therefore, even a single instruction in the program ROM 104a may be patched.

The present invention may be implemented as part of a code division multiple access (CDMA) system utilizing high performance DSPs executing instructions from a program ROM/RAM. The programming flexibility provided by the RAM memory space may allow updates to the programming as new communications standards evolve. Applications for existing standards, such as the third-generation (3G) CDMA2000™ (A registered trademark of Telecommunications Industry Association, Arlington, Va.) Release 0 solution, may also benefit from the programming flexibility as new features and capabilities may be added.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time periods but the term is not meant to be limited to events that begin at the same point in time, end at the same point in time, or have the same duration.

Comparison of the next address (e.g., matching address+1) before presenting the branch address on the data bus PDBI 117 generally prevents undesired behavior. There may be cases that the next address after a matching address is not one incremental step through the address space because of a pipeline mechanism of the processor 102. For example, patching after a conditional branch command may cause a significant change in the next address relative to the matching address. If the conditional branch is executed, the matching address may be on the address bus PAB 110 (i.e., as part of a fetch stage), but the next address should not be the consecutive address (matching address+1). Therefore, branching to the code stored in the patch RAM 104*b* should not happen. Watching for consecutive addresses between the matching address and the next address, and taking into account the read enable (e.g., PRE 140) into account, generally ensures a proper operation. In general, the present invention will avoid patching an address of a second part of a two word instruction. Such a case may cause decoding of the first part of the instruction, but may decode a branch opcode as the second part, which may cause unknown behavior.

In general terms, the aforementioned addresses can be regarded as regular numbers, i.e., the first address can be referred to as a first input number and the match address as a first number or first predetermined address. Similarly, the signal, patch_match, may be referred to as a first control signal, the signal, PM2D, may be referred to as a second control signal, and the signal, PRE, may be referred to as an input signal.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A programmable system, comprising:
a processor for generating at least a first address and a program read enable (PRE) signal;
a memory for storing data, addresses, and computer codes;
a first comparator circuit configured to assert at least a first control signal in response to the first address matching one of a plurality of first predetermined addresses stored therein, and to de-assert the first control signal when the matching between the first address and one of the first predetermined addresses is not present;
a second comparator circuit configured to assert a second control signal in response to: (i) an assertion of the PRE signal; (ii) an assertion of a signal generated by AND-logic-operation of the PRE signal and at least one delayed assertion of the first control signal; and (iii) a second address matching the first address and an intermediate address produced by adding a predetermined number to the first address, and to de-assert the second control signal when either the matching between the second address and the intermediate address is not present or the PRE signal is disabled by the processor, wherein the assertion of a signal generated by AND-logic-operation of the PRE signal and at least one delayed assertion of the first control signal is also asserted in response to a feedback of a delayed version of the second control signal; and
a generator circuit configured to output a predetermined instruction data stored therein in response to the assertion of the first control signal, and to output a second predetermined address corresponding to the first address in response to the assertion of the second control signal, wherein the processor is responsible for reading the predetermined instruction data and the second predetermined address.

2. The programmable system of claim 1, wherein the memory for storing computer codes comprises one or more read-only-memory (ROM) sections and one or more random-access-memory (RAM) sections, wherein the first address and the first predetermined address are addresses in the ROM sections and the second predetermined address is an address in the RAM section.

3. The programmable system of claim 1 further comprising at least one multiplexer configured to select either an output from the memory or an output from the generator circuit.

4. The programmable system of claim 1, wherein the predetermined number is equal to or more than 1.

5. The programmable system of claim 1, wherein the predetermined instruction data is a branch opcode.

6. The programmable system of claim 1, wherein the first comparator circuit comprises:
a plurality of multi-bit registers for storing the plurality of first predetermined addresses; and
a plurality of multi-bit comparators configured to compare the first address with each of the plurality of first predetermined addresses.

7. The programmable system of claim 1, wherein the second comparator circuit comprises:
at least one adder configured to add the predetermined number to the first address to generate the intermediate address; and
at least one comparator configured to compare the intermediate address with the second address.

8. The programmable system of claim 1, wherein the generator circuit comprises:
a plurality of multi-bit registers for storing a plurality of predetermined addresses that the second predetermined address is a member thereof;
at least one multiplexer configured to select either the predetermined instruction data or the second predetermined address for output and the selection is controlled by the first control signal.

9. An electronics system, comprising:
a processor for generating at least a first address and a program read enable (PRE) signal;
a first comparator circuit configured to assert at least a first control signal in response to the first address matching one of a plurality of first predetermined addresses stored therein, and to de-assert the first control signal when the matching between the first address and one of the first predetermined addresses is not present;
a second comparator circuit configured to assert a second control signal in response to: (i) an assertion of the PRE signal; (ii) an assertion of a signal generated by AND-logic-operation of the PRE signal and at least one delayed assertion of the first control signal; and (iii) a second address matching the first address and an intermediate address produced by adding a predetermined number to the first address, and to de-assert the second control signal when either the matching between the second address and the intermediate address is not present or the PRE signal is disabled by the processor, wherein the assertion of a signal generated by AND-logic-operation of the PRE signal and at least one delayed assertion of the first control signal is also asserted in response to a feedback of a delayed version of the second control signal; and
a generator circuit configured to output a predetermined instruction data stored therein in response to the assertion of the first control signal, and to output a second predetermined address corresponding to the first address in response to the assertion of the second control signal.

10. The electronics system of claim 9, wherein the processor is configured to read the predetermined instruction data and the second predetermined address.

11. The electronics system of claim 9, wherein the first address and the first predetermined address are addresses in a read-only-memory (ROM) and the second predetermined address is an address in a random-access-memory (RAM), wherein the electronics system further comprises a memory comprising the ROM and the RAM.

12. The electronics system of claim 11 further comprising at least one multiplexer configured to select either an output from the memory or an output from the generator circuit.

13. The electronics system of claim 9, wherein the predetermined number is equal to or more than 1.

14. The electronics system of claim 9, wherein the predetermined instruction data is a branch opcode.

15. The electronics system of claim 9, wherein the first comparator circuit comprises:
at least one register for storing the plurality of first predetermined addresses; and
at least one comparator configured to compare the first address with each of the plurality of first predetermined addresses.

16. The electronics system of claim 9, wherein the second comparator circuit comprises:
at least one adder configured to add the predetermined number to the first address to generate the intermediate address; and
at least one comparator configured to compare the intermediate address with the second address.

17. The electronics system of claim 9, wherein the generator circuit comprises:
at least one register for storing a plurality of predetermined addresses that the second predetermined address is a member thereof;
at least one multiplexer configured to select either the predetermined instruction data or the second predetermined address for output and the selection is controlled by the first control signal.

18. A method for generating a patch address for a memory in a programmable system having a processor that generates at least a first address and a program read enable (PRE) signal, the method comprising:
asserting at least one first control signal in response to the first address matching one of a plurality of first predetermined addresses;
asserting a second control signal in response to: (i) an assertion of the PRE signal; (ii) an assertion of a signal generated by AND-logic-operation of the PRE signal and at least one delayed assertion of the first control signal; and (iii) a second address matching the first address and an intermediate address produced by adding a predetermined number to the first address, wherein the assertion of a signal generated by AND-logic-operation of the PRE signal and at least one delayed assertion of the first control signal is also asserted in response to a feedback of a delayed version of the second control signal;
outputting a predetermined instruction data in response to the assertion of the first control signal, and outputting a second predetermined address corresponding to the first address in response to the assertion of the second control signal;
reading the predetermined instruction data in lieu of a data in the memory, which is pointed to by the first address, wherein the predetermined instruction data is a branch opcode; and
reading the second predetermined address as a patch address in lieu of a data stored in the memory, which is pointed to by the second address.

19. The method of claim 18, wherein the predetermined number is equal to or more than 1.

* * * * *